United States Patent

Park et al.

[11] Patent Number: 5,710,051
[45] Date of Patent: Jan. 20, 1998

[54] METHOD FOR MANUFACTURING A SINGLE ELECTRON TRANSISTOR BY USING A SCANNING TUNNELING MICROSCOPY

[75] Inventors: Kang-Ho Park; Jeong-Sook Ha; El-Hang Lee, all of Daejeon, Rep. of Korea

[73] Assignee: Electronics and Telecommunications Research Institute, Daejeon-shi, Rep. of Korea

[21] Appl. No.: 694,316

[22] Filed: Aug. 8, 1996

[30] Foreign Application Priority Data

Dec. 21, 1995 [KR] Rep. of Korea .................. 95-53661

[51] Int. Cl.$^6$ .................................................. H01L 21/00
[52] U.S. Cl. ............................... 437/7; 437/40; 437/228
[58] Field of Search .......................... 437/7, 8, 40, 170, 437/228

[56] References Cited

U.S. PATENT DOCUMENTS

| | | | |
|---|---|---|---|
| 5,051,379 | 9/1991 | Bayer et al. | 437/228 |
| 5,266,502 | 11/1993 | Okada et al. | 437/52 |
| 5,612,233 | 3/1997 | Roesner et al. | 437/40 |
| 5,618,760 | 4/1997 | Soh et al. | 437/228 |

Primary Examiner—Chandra Chaudhari
Attorney, Agent, or Firm—Antonelli, Terry, Stout & Kraus LLP

[57] ABSTRACT

A method for the manufacture of a single electron transistor (SET) in a vacuum state, wherein the SET operates in room temperature, comprises the steps of: approaching an Au tip of a scanning tunneling microscopy (STM) on top of a silicon-substrate having a silicon oxide layer on top thereof to maintain a distance from top of the oxide layer to end of the Au tip of the STM; forming an Au cluster on top of the oxide layer by using a low field evaporation method employing the STM, thereby forming a two dimensional island structure on top of the oxide layer, wherein the low field evaporation method employing the STM generates an electronic pulse between top of the oxide layer and end of the Au tip of the STM by applying a voltage to the Au tip of the STM; forming a source and a drain to both sides of the Au cluster in the two dimensional island structure, respectively, in such a way that the Au cluster in the two dimensional island structure maintains a gap with the source and the drain, thereby forming an electron tunneling barrier on right and left of the Au cluster in the two dimensional island structure; and joining a gate on bottom of the silicon-substrate.

4 Claims, 2 Drawing Sheets

METHOD FOR MANUFACTURING A SINGLE ELECTRON TRANSISTOR BY USING A SCANNING TUNNELING MICROSCOPY

FIELD OF THE INVENTION

The present invention relates to a single electron transistor (SET); and, more particularly, to a method for the manufacture of the SET, wherein the SET has an island structure on top of a silicon oxide layer therein by using a low field evaporation method employing a scanning tunneling microscopy (STM), thereby allowing the SET to operate in a room temperature.

BACKGROUND OF THE INVENTION

A single electron transistor (SET) is well known as a coming electronic element capable to produce a large scale integration in a low electronic power. In order to attain it, it is necessary to improve a method for the manufacture of SET capable of modulating a respective electron.

However, a conventional SET operates only in a low temperature due to a limitation of the size thereof, making it impossible to operate in a room temperature, thereby limiting the industrial use thereof.

In order to realize the operation of the SET in a room temperature, the formation of an island structure having a cluster on top of a silicon oxide layer in the SET is required during the manufacture thereof, wherein the formation of the island structure on top of the silicon oxide layer in the SET decreases a thermal fluctuation occurred to the SET and a capacitance of the SET during the operation of the SET.

During the operation of the SET in a room temperature, in order to control the thermal fluctuation occurred thereto, a variation of an electro-chemical potential of a conductor should be larger than the value of the thermal fluctuation occurred to the SET, and furthermore, in order to decrease the capacitance of the SET, the size of the island structure in the SET should be formed smaller than nm size.

Since the SET is formed by using a conventional method, e.g., a photolithography or an electron beam lithography method, however, it is impossible to form the SET smaller than 0.1 μm, thereby making the formation of the SET for operating in a room temperature to be impossible.

As is well known, a structure of a various am size is generally formed by using a scanning tunneling microscopy (STM) or an atomic force microscopy (AFM) which has not been applied to the manufacture of the SET, wherein the STM functions as a microscopy capable of defining a nano structure, i.e., electron structure or atom structure, as well as a means for nano-patterning.

SUMMARY OF THE INVENTION

It is, therefore, a primary object of the present invention to provide a method for the manufacture of a single electron transistor (SET), wherein the SET has an island structure on top of a silicon oxide layer therein by using a low field evaporation method employing a scanning tunneling microscopy (STM), thereby allowing the SET to operate in a room temperature.

In accordance with one aspect of the present invention, there is provided a method for the manufacture of a single electron transistor (SET), wherein the SET is capable to operate in a room temperature, the method comprising the steps of: approaching an Au tip of a scanning tunneling microscopy (STM) on top of a silicon-substrate having a silicon oxide layer on top thereof to maintain a distance from top of the silicon oxide layer to end of the Au tip of the STM, wherein the distance from top of the silicon oxide layer to end of the Au tip of the STM is 4 to 6 Å; forming an Au cluster on top of the silicon oxide layer by using a low field evaporation method employing the STM, thereby forming a two dimensional island structure on top of the silicon oxide layer, wherein the low field evaporation method employing the STM generates an electronic pulse between top of the silicon oxide layer and end of the Au tip of the STM by applying a voltage of 5 to 10 V to the Au tip of the STM; forming a source and a drain to both sides of the Au cluster in the two dimensional island structure, respectively, in such a way that the Au cluster in the two dimensional island structure maintains a gap with the source and the drain, thereby forming an electron tunneling barrier on right and left of the Au cluster in the two dimensional island structure; and joining a gate on bottom of the silicon-substrate.

BRIEF DESCRIPTION OF THE DRAWINGS

The above and other objects and features of the present invention will become apparent from the following description of preferred embodiments when taken in conjunction with the accompanying drawings, in which.

DETAILED DESCRIPTION OF THE PREFERRED EMBODIMENTS

Figure 1A:
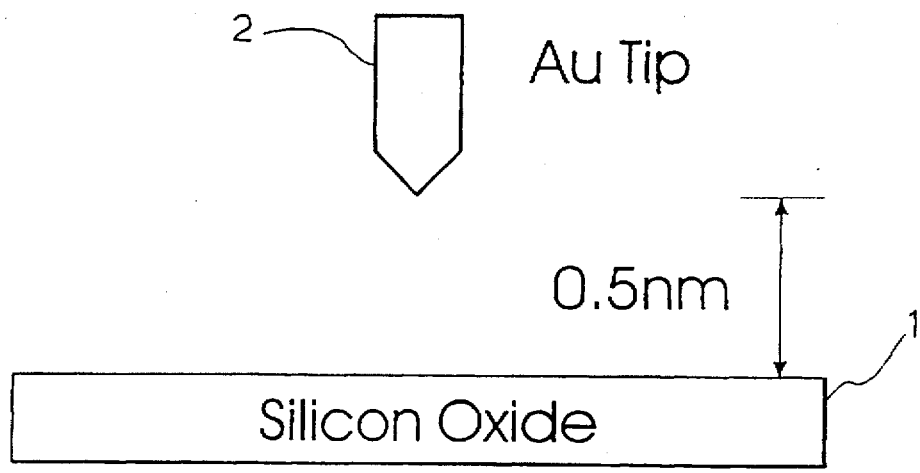
FIGS. 1A and 1B provide schematic views setting forth a method for the formation of an island structure of nm size on top of a silicon oxide layer by using a low field evaporation method employing a scanning tunneling microscopy (STM) during the manufacture of a single electron transistor (SET) in accordance with the present invention.
Figure 1B:
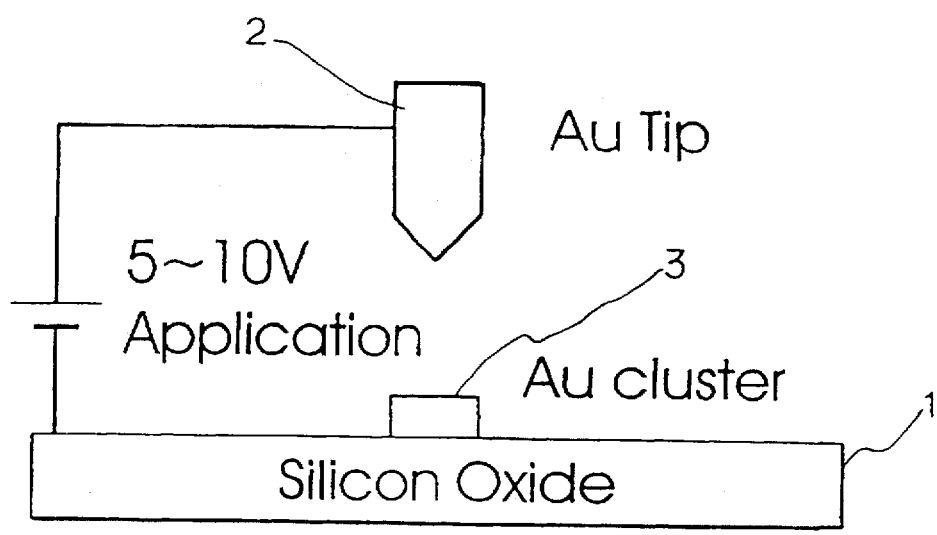

There are shown in FIGS. 1A and 1B schematic views setting forth a method for the formation of an island structure of nm size on top of a silicon oxide layer by using a low field evaporation method employing a scanning tunneling microscopy (STM) during the manufacture of a single electron transistor (SET) in accordance with the present invention.

The process for the manufacture of the SET begins with the preparation of a silicon-substrate (not shown) having a silicon oxide layer (1) on top thereof, in a vacuum state, wherein the silicon oxide layer (1) has a thickness of 100 Å. Thereafter, an Au tip (2) of a scanning tunneling microscopy (STM) is approached to top of the silicon oxide layer (1) to maintain a distance from top of the silicon oxide layer (1) to end of the Au tip (2) of the STM, wherein the distance from top of the silicon oxide layer (1) to end of the Au tip (2) of the STM is 4 to 6 Å, as shown in FIG. 1A.

In a subsequent step, an Au cluster (not shown) is formed on top of the silicon oxide layer (1) by using a low field evaporation method employing the STM, thereby forming a two dimensional island structure (3) having the Au cluster on top of the silicon oxide layer (1), as shown in FIG. 1B. In the above low field evaporation method employing the STM, a voltage of 5 to 10 V is applied to the Au tip (2) of the STM in such a way that an electronic pulse generates between top of the silicon oxide layer (1) and end of the Au tip (2) of the STM, thereby forming the two dimensional island structure (3) having the Au cluster on top of the silicon oxide layer (1).

In an ensuing step, a source (not shown) and a drain (not shown) are, respectively, formed to both sides of the Au cluster in the two dimensional island structure (3) in such a way that the Au cluster in the two dimensional island structure (3) maintains a gap with the source and the drain, thereby forming an electron tunneling barrier on right and left of the Au cluster in the two dimensional island structure (3).

Finally, a gate (not shown) is joined on bottom of the silicon-substrate, thereby forming the SET.

In the above SET, an electron tunneling in the electron tunneling barrier should be generally required, and a capacitance in the electron tunneling barrier should be below $10^{-19}$F. Furthermore, in order to control a thermal fluctuation, a capacitance between a gate and the island structure should be also maintained below $10^{-19}$F.

Figure 2:
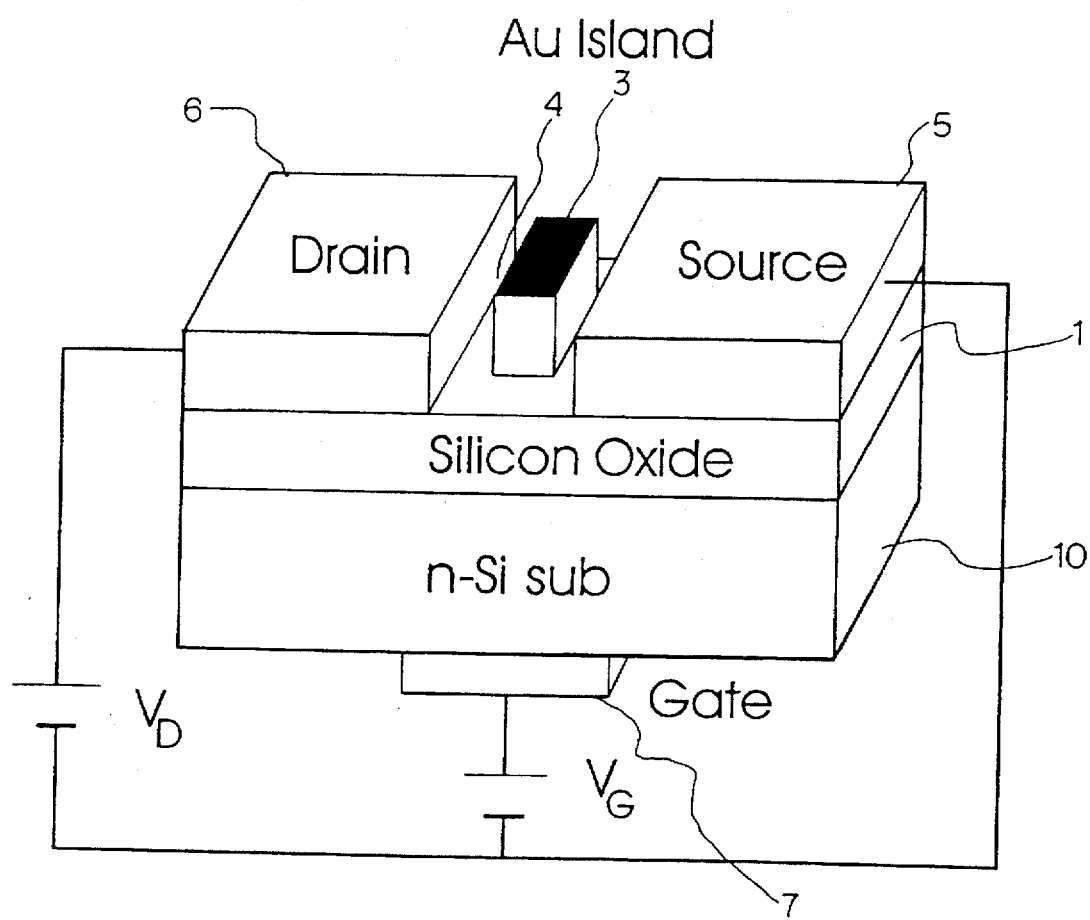
FIG. 2 produces a detailed view of a single electron transistor (SET) manufactured by the inventive method.

In FIG. 2, there is produced a detailed view of a single electron transistor (SET) manufactured by the inventive method.

In the SET, a silicon oxide layer (1) and a gate (7) are, respectively, located on top and bottom of a silicon-substrate (10). The silicon oxide layer (1) has an island structure (3) having an Au cluster, a drain (6) and a source (5) on top thereof. The Au cluster in the island structure (3) is positioned between the drain (6) and the source (5), and maintains a gap with the drain (6) and the source (5), wherein the gap functions as an electron tunneling barrier (4).

In contrast with the conventional SET capable to operate only in a low temperature due to a limitation of the size thereof, in the SET manufactured by the inventive method, since the island structure having the Au cluster is formed on top of the silicon oxide layer in various nm size, the SET could be operated in a room temperature, thereby increasing the industrial use thereof.

While the present invention has been described with respect to certain preferred embodiments only, other modifications and variations may be made without departing from the scope of the present invention as set forth in the following claims.

What is claimed is:

1. A method for the manufacture of a single electron transistor (SET), wherein the SET is capable to operate in a room temperature, the method comprising the steps of:

approaching an Au tip of a scanning tunneling microscopy (STM) on top of a silicon-substrate having a silicon oxide layer on top thereof to maintain a distance from top of the silicon oxide layer to end of the Au tip of the STM;

forming an Au cluster on top of the silicon oxide layer by using a low field evaporation method employing the STM, thereby forming a two dimensional island structure on top of the silicon oxide layer, wherein the low field evaporation method employing the STM generates an electronic pulse between top of the silicon oxide layer and end of the Au tip of the STM by applying a voltage to the Au tip of the STM;

forming a source and a drain to both sides of the Au cluster in the two dimensional island structure, respectively, in such a way that the Au cluster in the two dimensional island structure maintains a gap with the source and the drain, thereby forming an electron tunneling barrier on right and left of the Au cluster in the two dimensional island structure; and joining a gate on bottom of the silicon-substrate.

2. The method of claim 1, wherein the distance from top of the silicon oxide layer to end of the Au tip of the STM is 4 to 6 Å.

3. The method of claim 1, wherein the voltage applied to the Au tip of the STM is 5 to 10 V.

4. A method for the manufacture of a single electron transistor (SET) in a vacuum state, wherein the SET is capable to operate in a room temperature, the method comprising the steps of:

approaching an Au tip of a scanning tunneling microscopy (STM) on top of a silicon-substrate having a silicon oxide layer on top thereof to maintain a distance from top of the silicon oxide layer to end of the Au tip of the STM, wherein the distance from top of the silicon oxide layer to end of the Au tip of the STM is 4 to 6 Å;

forming an Au cluster on top of the silicon oxide layer by using a low field evaporation method employing the STM, thereby forming a two dimensional island structure on top of the silicon oxide layer, wherein the low field evaporation method employing the STM generates an electronic pulse between top of the silicon oxide layer and end of the Au tip of the STM by applying a voltage of 5 to 10 V to the Au tip of the STM;

forming a source and a drain to both sides of the Au cluster in the two dimensional island structure, respectively, in such a way that the Au cluster in the two dimensional island structure maintains a gap with the source and the drain, thereby forming an electron tunneling barrier on right and left of the Au cluster in the two dimensional island structure; and joining a gate on bottom of the silicon-substrate.

* * * * *